(12) United States Patent
Tu et al.

(10) Patent No.: US 7,673,198 B1
(45) Date of Patent: Mar. 2, 2010

(54) TESTING SYSTEM AND RELATED TESTING METHOD FOR AN ANALOG DESIGN UNDER TEST

(75) Inventors: Li-Chun Tu, Taipei (TW); Chun-Yu Lin, Taipei Hsien (TW); Chao-Long Tsai, Hsin-Chu (TW); Chun-Chieh Shih, Hsin-Chu Hsien (TW)

(73) Assignee: MediaTek Inc., Hsin-Chu Hsien (TW)

( * ) Notice: Subject to any disclaimer, the term of this patent is extended or adjusted under 35 U.S.C. 154(b) by 427 days.

(21) Appl. No.: 11/164,476

(22) Filed: Nov. 23, 2005

(51) Int. Cl.
*G01R 31/28* (2006.01)
(52) U.S. Cl. .................. 714/724; 714/738; 714/739; 714/740; 714/741
(58) Field of Classification Search ............... 714/724, 714/738, 739, 740, 742
See application file for complete search history.

(56) References Cited

U.S. PATENT DOCUMENTS 4,774,688 A * 9/1988 Kobayashi et al. .......... 708/207
6,408,412 B1 6/2002 Rajsuman
6,714,888 B2 3/2004 Mori et al.
6,925,408 B2 * 8/2005 Premy et al. ................ 702/120

OTHER PUBLICATIONS

Benoit Dufort and Gordon W. Roberts., "On-chip analog signal generation for mixed-signal built-in self-test", IEEE J. of Solid-Stated Circuits, Mar. 1999, pp. 318-330, vol. 34, No. 3.

* cited by examiner

*Primary Examiner*—John J Tabone, Jr.
(74) *Attorney, Agent, or Firm*—Winston Hsu

(57) ABSTRACT

A testing system includes an integrated circuit having an analog design under test and a processor; an digital-to-analog converter (DAC), coupled to the analog design under test and the processor, for converting a digital testing sequence output of the processor into an analog testing sequence fed into the analog design under test; a analog-to-digital converter (ADC), coupled to the analog design under test and the processor, for converting an analog testing response of the analog design under test into a digital testing response fed into the processor; and an external tester, coupled to the processor of the integrated circuit, for sequentially outputting a program sequence to the processor; wherein the processor executes the program sequence without un-predictable conditional jump to get a testing result of the testing system and then outputs the testing result to the external tester.

12 Claims, 6 Drawing Sheets

TESTING SYSTEM AND RELATED TESTING METHOD FOR AN ANALOG DESIGN UNDER TEST

BACKGROUND

The present invention relates to a testing system for an integrated circuit, and more specifically, to a testing system and related testing method for an analog design under test of an integrated circuit using a built-in processor to execute a program sequence without conditional jumps.

Please refer to FIG. 1. FIG. 1 shows a block diagram of a conventional analog testing system 100. Traditionally, to test a plurality of analog design under tests (DUTs) 102, 103 of an integrated circuit 104 (for example, a SOC design) requires an analog channel of an external test machine 101 electrically connecting analog DUTs and external test machine 101. Certainly, the performance of this kind of analog testing system 100 is limited due to a settle time required to stabilizing signals transmitted between external test machine 101 and the integrated circuit 104. For example, when starting a new test session, the settle time for this new test session increases the whole testing time. Moreover, resolution of the analog channel of external test machine 101 also plays an important role. Obviously, these issues are closely related to cost and price of the external test machine 101.

Please refer to FIG. 2. FIG. 2 shows a block diagram of a conventional analog testing system 200 with an external processor 201. As shown in FIG. 2, the analog testing system 200 includes an external processor 201 coupled to an integrated circuit 206, where the integrated circuit 206 has a plurality of analog design under tests (DUTs) 202, 203, a built-in digital-to-analog converter (DAC) 204, and a built-in analog-to-digital converter (ADC) 205. The analog testing system 200 tests analog design under tests 202, 203 with a built-in DAC 204 used to convert a digital testing sequence generated from the external processor 201 into analog domain and feed the converted signals into the analog design under tests 202, 203. Then, the built-in ADC 205 is utilized to convert a testing response of the analog design under tests 202, 203 into digital domain for further processing and determination. With the help of built-in ADC 205 and DAC 204, the settle time of the testing system 200 is substantially reduced. Moreover, cost of analog testing is lowered, accordingly.

As shown in FIG. 1 and FIG. 2, no matter using external test machine 101 or external processor 201, ADC 205 and DAC 204 for testing analog under tests 102, 103, 202, 203, it requires an analog signal generator and a measuring tool. Using DAC 204 and ADC 205 together with external processor 201 as the analog signal generator to generate test patterns and the measuring tool for analyzing test results respectively has many advantages. For instance, if a testing sequence, i.e. the output of the DAC 204, is changed or the measuring point, i.e. the input of the ADC 205, is altered, it will not induce any extra settle time for starting the corresponding analog testing procedure because DAC 204 and ADC 205 are built-in. Analog testing system 200 certainly reduces the operating time required for analog testing. However, to realize analog testing system 200 as mentioned above, in most case external processor 201 is generally implemented as a testing module of external test machine 101 as shown in FIG. 1 Cost of external processor 201 will certainly increase the cost of applying this kind of testing system.

Please refer to FIG. 3. FIG. 3 shows a block diagram of a conventional analog testing system 300 using an internal processor 301, built-in DAC 304, built-in ADC 305, together with an internal memory 306 and a program loader 308. Built-in DAC 304 and built-in ADC 305 are connected to analog design under test 302 and 303. As shown in FIG. 3, the analog testing system 300 has an integrated circuit 307 coupled to a program loader 308, where the integrated circuit 307 includes an internal processor 301, a plurality of analog design under tests (DUTs) 302, 303, a built-in digital-to-analog converter (DAC) 304, a built-in analog-to-digital converter (ADC) 305, and an internal memory 306. In this testing system 300, internal processor 301 plays the role as external processor 201 shown in FIG. 2 but has an advantage of reducing the cost of testing module of the external test machine by using a processor which is originally embedded in the integrated circuit 307. However, the analog testing system 300 needs extra efforts such as applying a processing program for controlling internal processor 301 to generate the testing sequence and to measure the testing response to make decision if the analog testing result is pass or fail. To this end, the processing program must be input to internal processor 301 in a form of program sequence. Moreover, since the processing program must do conditional logical operation to decide if the analog testing result is pass or fail, executable codes for doing the logical operation in all kinds of conditions must be preloaded into the internal memory 306 through the program loader 308 so that the processing program is able to do logical operation, such as perform an "if" condition or an "else" condition. For example, a program sequence PROGRAM_1 (only part of the program sequence is illustrated) with conditional jumps is shown as below:

Line1: int result; //0 means testing failure, 1 means testing pass
Line2: if (analog_measure_1 meet spec_1) {result=1;}
Line3: else {result=0;}

In PROGRAM_1, if a condition "analog_measure_1 meet spec_1 is true, then the program sequence will conditionally jump to "result=1" in Line2. Otherwise, if the condition is false, the program sequence will conditionally jump to "result=0" in Line3. For storing these two conditions in Line2 and Line3 previously, it requires more cost in internal memory 306 and time for preloading the program sequence PROGRAM_1 into the internal memory 306, which could possibly dominate the whole testing time. In short, doing analog testing with analog testing system 300 is not efficient enough because the program with conditional jump operations need to be loaded into internal memory 306 first.

SUMMARY

It is therefore one of the objectives of the claimed invention to provide a testing system and related testing method for an analog design under test of an integrated circuit using a built-in processor to execute a program sequence without conditional jump, to solve the above-mentioned problem.

According to an embodiment of the present invention, a testing system includes an integrated circuit having an analog design under test and a processor; a digital-to-analog converter (DAC) for converting a digital testing sequence output from the processor into an analog testing sequence fed into the analog design under test; an analog-to-digital converter (ADC) for converting an analog testing response of the analog design under test into a digital testing response fed into the processor; and an external tester for sequentially outputting a program sequence to the processor. The processor executes the program sequence without processing conditional jump to perform the testing procedure of the testing system.

According to an embodiment of the present invention, a testing method includes providing an integrated circuit, the integrated circuit comprising an analog design under test and a processor; converting a digital testing sequence output of the processor into an analog testing sequence fed into the analog design under test; converting an analog testing response of the analog design under test into a digital testing response fed into the processor; providing an external tester and utilizing the external tester for sequentially outputting a program sequence to the processor; and utilizing the processor to execute the program sequence without conditional jump to get a testing result of the testing system and then output the testing result to the external tester.

Since the program sequence can be real-time inputted into the internal processor of the integrated circuit, the testing system and related testing method according to the present invention do not need any memory for preloading the program sequence, resulting in shorter testing time and lower cost.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
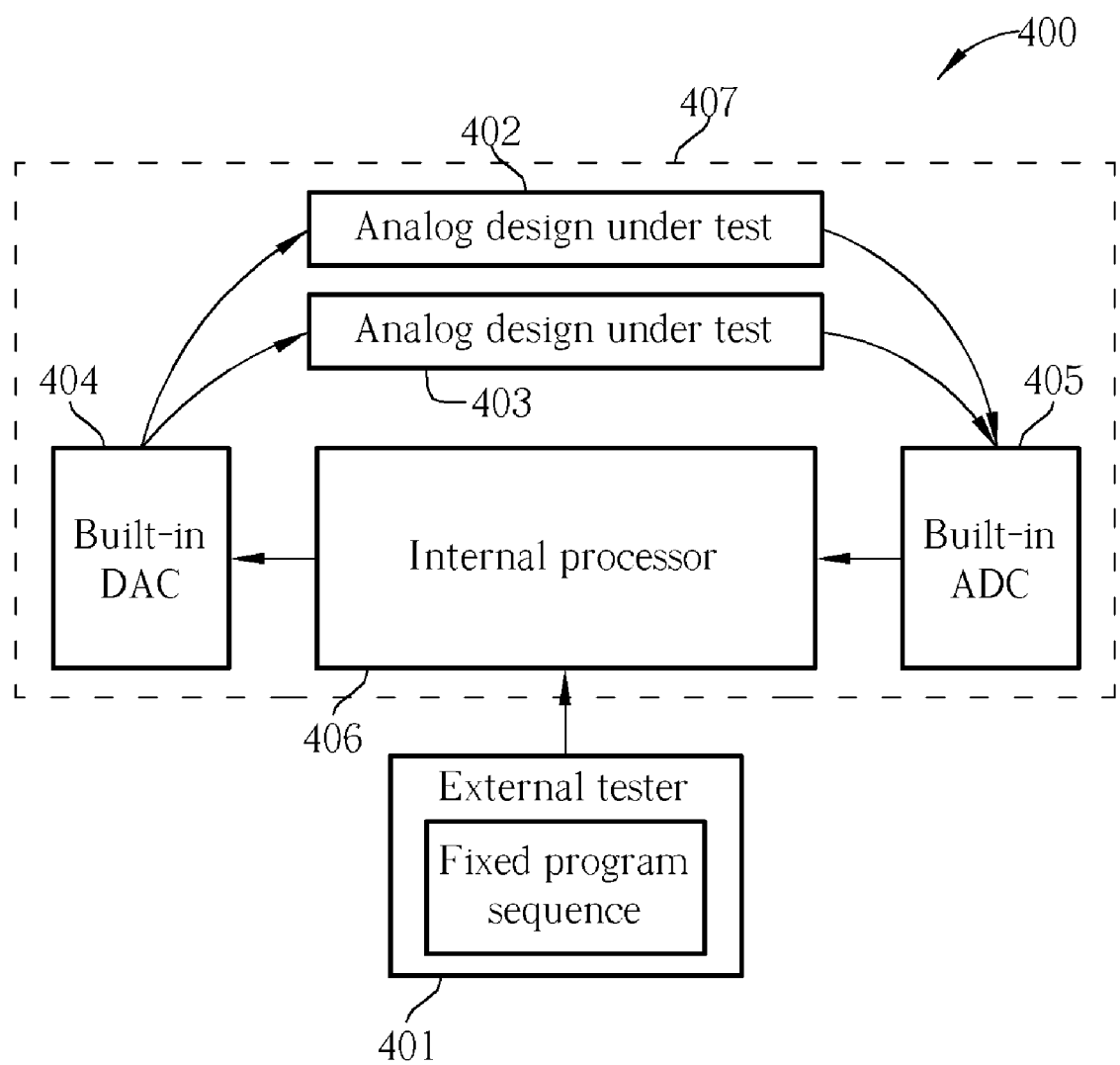
FIG. 4 shows a block diagram of an analog testing system according to an embodiment of the present invention.

Please refer to FIG. 4. FIG. 4 shows a block diagram of an analog testing system 400 according to an embodiment of the present invention. As shown in FIG. 4, the analog testing system 400 has an external tester 401 coupled to an integrated circuit 407 (for example, a SOC design). The integrated circuit 407 includes a plurality of analog design under tests (DUTs) 402, 403, a built-in digital-to-analog converter (DAC) 404, a built-in analog-to-digital converter (ADC) 405, and an internal processor 406. The internal processor 406 sequentially receives the fixed program sequence from the external tester 401 (i.e. the external tester 401 sequentially outputs a program sequence with one by one, in an order the program sequence being written, to the processor), and then generates digital testing sequence, used for testing the functionality of the analog design under tests 402, 403, according to instructions of the fixed program sequence. Since the generation of the digital testing sequence is well known to those skilled in this art, further description is omitted here for brevity. The built-in ADC 404 is used to convert the digital testing sequence generated from the internal processor 406 into an analog testing sequence fed into the analog design under tests 402, 403, while the built-in ADC 405 is used to convert an analog testing response of the analog design under tests 402, 403 into a digital testing response fed into the internal processor 406. The external tester 401 acts as a program loader to feed a fixed program sequence into the internal processor 406. In the end, the internal processor 406 gets the testing result by comparing the digital testing response with an expected result to generate a comparing result.

Please note that the internal processor 406 is capable of supporting running "conditional instructions" without "conditional jumps". The "conditional instructions" means instructions can "getting different results depending on different conditions, in a single instruction". This feature causing the program branch is predictable, and a fixed program sequence to be sequentially executed is possible. In contrast to the related art testing system 300 where the internal processor 301 can not predict the program branch, so that a preloaded program from the internal memory 306 is needed.

If we can find a processor with "conditional instructions", the assembly language of the above-mentioned program sequence PROGRAM_1 can be modified as program sequence PROGRAM_2, (only part of the program sequence is shown for illustrative purposes) which is written as below:

Line1: int result=1; //0 means testing failure, 1 means testing pass

Line2: if (analog_measure_1 does not meet spec_1) {result=0;}

Certainly, as shown in PROGRAM_2, if the internal processor 406, in a first embodiment of the present invention, supports the assembly language code written in Line2, no conditional jump is performed. As to the program sequence PROGRAM_2, the "result" is firstly set by 1 and may be over-written according to the decision result of "analog_measure_1 not meet spec_1". In other words, the testing result in the beginning is assumed to be "1". Then, the following procedure is to validate the assumption. If the analog_measure_1 do not meet spec_1, the testing result is changed. Since there is no un-predictable conditional jump during the execution of the program sequence PROGRAM_2, the whole program codes are not required to be preloaded. That is, the program sequence PROGRAM_2 is allowed to be executed by the internal processor 406 line by line and the buffering memory is not needed, achieving the directly execution and reducing the cost of analog testing.

Following the above concept, the program sequence PROGRAM_2 could be rewritten to meet different requirements of internal processor implemented in the integrated circuit 407. For real-time inputting fixed program sequence to the internal processor 406, in a second embodiment of the present invention the internal processor 406 supports execution of the following assembly language program sequence PROGRAM_3 which is re-written based on aforementioned program sequence PROGRAM_2:

Line1: result=1;

Line2: analog_measure_1 meet spec_1?

Line3: if no, result=0;

In Line3, whether the "result" is to be changed to 0 or not depends on an execution result of Line2, i.e. if the "analog_measure_1" meets the "spec_1", the result keeps as 1; otherwise, the result is changed to 0. In this embodiment, a flag is asserted to indicate the execution result of Line2. For instance, the flag is set by "1" when "analog_measure_1" does not meet "spec_1". Then, when the internal processor 406 executes Line3, the flag is read to determine if the "result" should be modified. Since there is still no un-predictable conditional jump during the execution of the program sequence PROGRAM_3, the whole program codes are not required to be preloaded. That is, the program sequence PROGRAM_3 is allowed to be executed by the internal processor 406 line by line and the buffering memory is not needed, achieving the directly execution and reducing the cost of analog testing.

For directly inputting fixed program sequence, in a third embodiment of the present invention the internal processor 406 supports execution of the following assembly language program sequence PROGRAM_4 which is re-written based on PROGRAM_2:

Line1: result=1;
Line2: analog_measure_1 meet spec_1?
Line3: result=result+flag;

In Line3, the "result" is changed to 0 or not depending on the execution result of Line2, that is, the "analog_measure_1" meets the "spec_1" or not. In this embodiment, a flag is asserted according to the execution result of Line2. For instance, the flag is set by "1" when "analog_measure_1" does not meet "spec_1". Then, the result is changed from 1 to 0 due to the flag. Since there is no un-predictable conditional jump during the execution of the program sequence PROGRAM_4, the whole program codes are not required to be preloaded. That is, the program sequence PROGRAM_4 is allowed to be executed by the internal processor 406 line by line and the buffering memory is needed no more, achieving the directly execution and reducing the cost of analog testing.

Figure 5:
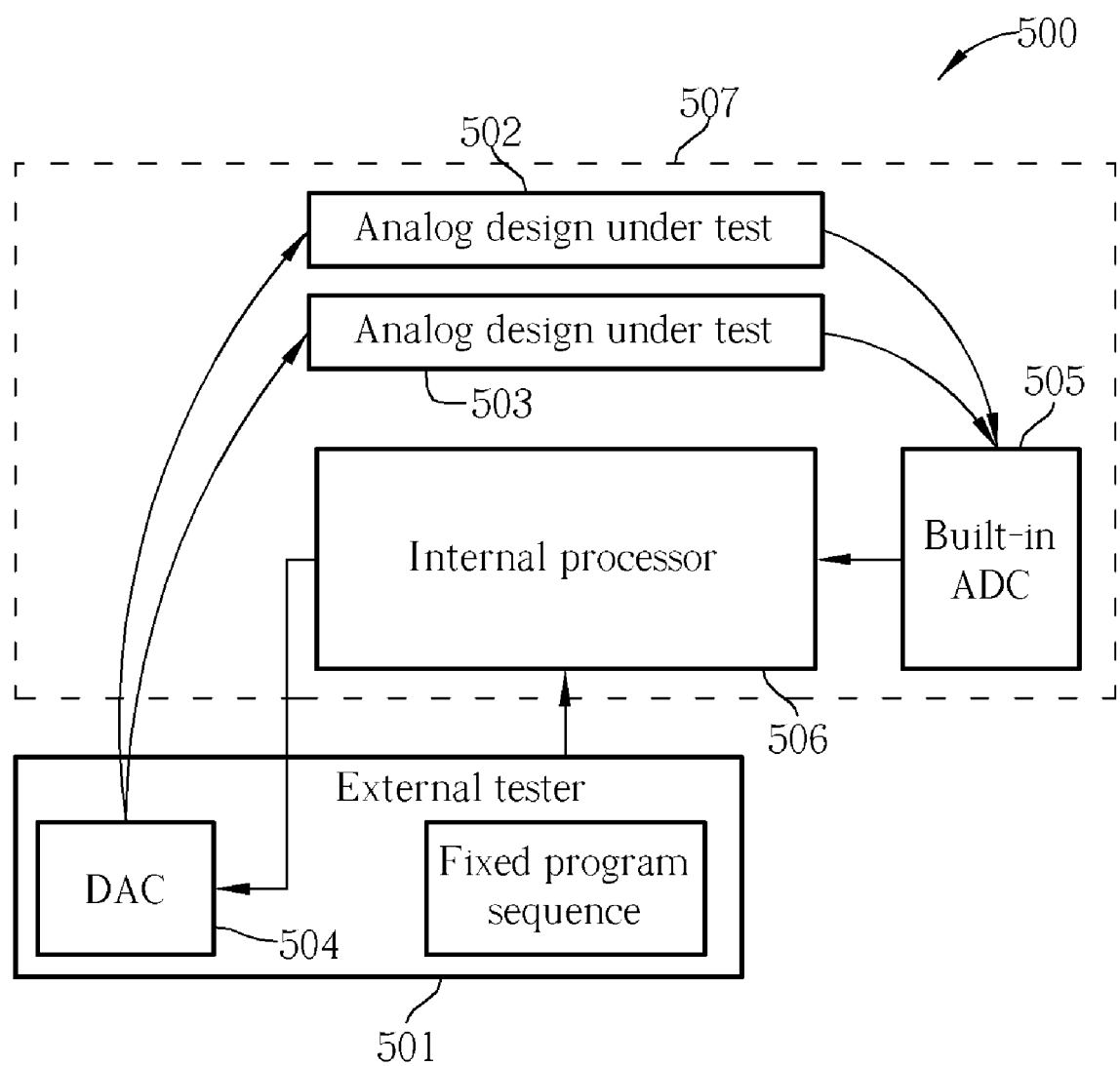
FIG. 5 shows a block diagram of an analog testing system according to a first modified embodiment of the present invention.
Figure 6:
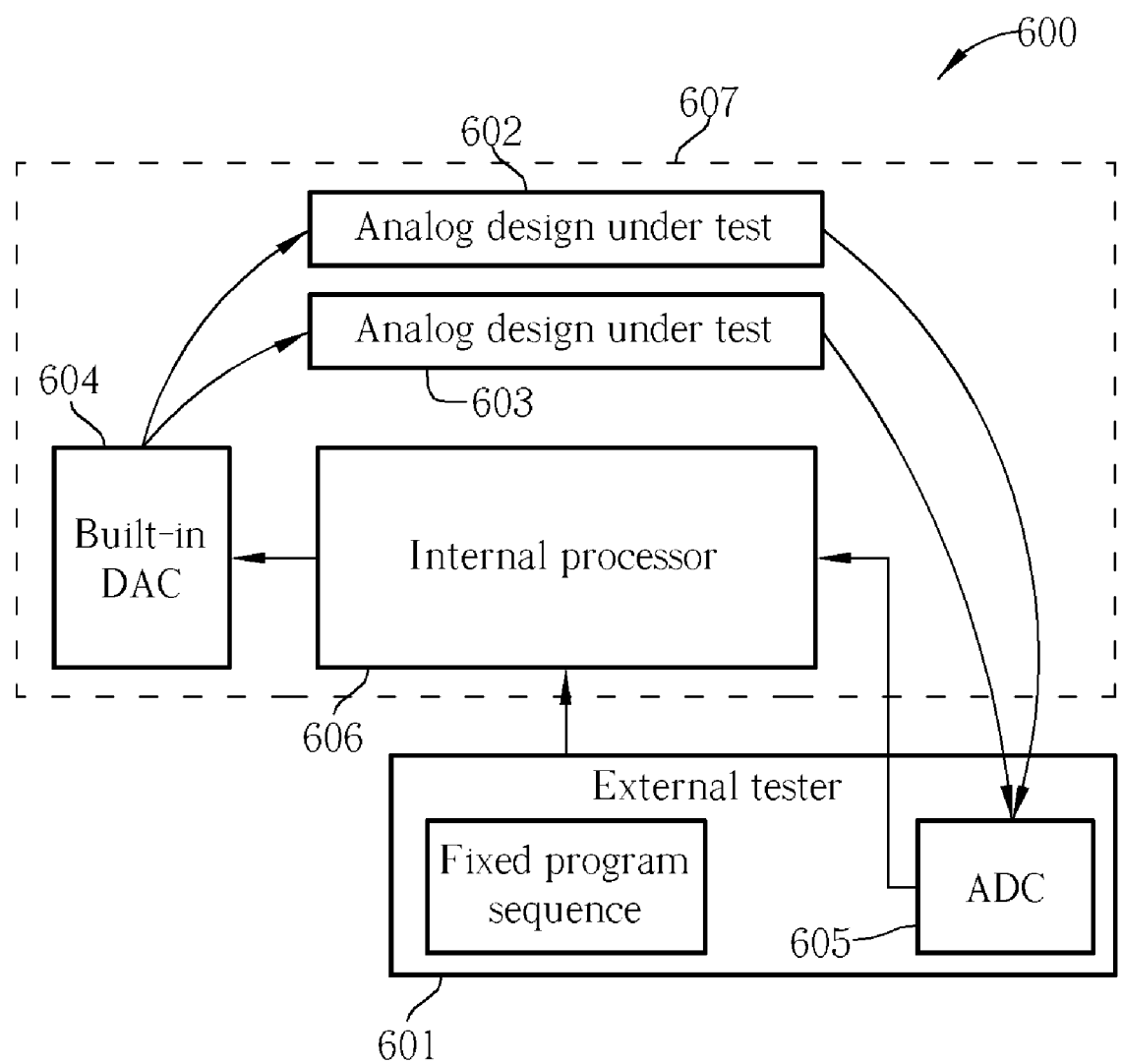
FIG. 6 shows a block diagram of an analog testing system according to a second modified embodiment of the present invention.

Please note that, in the above embodiments, both the digital-to-analog converter (i.e. the built-in DAC 404) and the analog-to-digital converter (i.e. the built-in ADC 405) of the integrated circuit 407 are utilized. However, the analog testing system 400 is not limited to using the digital-to-analog converter and the analog-to-digital converter embedded in the integrated circuit 407 having the analog design under tests 402, 403. For example, the required digital-to-analog converter is placed on the external tester 401, the required analog-to-digital converter is placed on the external tester 401, or both the digital-to-analog converter and the analog-to-digital converter are placed on the external tester 401. FIG. 5 shows a block diagram of an analog testing system 500 according to a first modified embodiment. The difference between the embodiments shown in FIG. 4 and FIG. 5 is that in FIG. 4 the DAC 404 is embedded in the integrated circuit 407, while in FIG. 5 the DAC 504 is included in the external tester 501. Since the operation of the embodiment shown in FIG. 5 is quite similar to that of the embodiment shown in FIG. 4, further illustrations are omitted herein. One thing deserving notice is that in FIG. 5, the connection between the DAC 504 and the internal processor 506 is optional. Under some circumstances, through the DAC 504, signal(s) generated by the external tester 501 can be sent to the analog design under tests 502 and 503 directly, rather than passing through the internal processor 506. FIG. 6 shows a block diagram of an analog testing system 600 according to a second modified embodiment. The difference between the embodiments shown in FIG. 4 and FIG. 6 is that in FIG. 4 the ADC 405 is embedded in the integrated circuit 407, while in FIG. 6 the ADC 605 is included in the external tester 601. Since the operation of the embodiment shown in FIG. 6 is similar to that of the embodiment shown in FIG. 4, further illustrations are omitted herein. In the above-mentioned two modified embodiments, the same objective of testing an analog design under test using a built-in processor to execute a program sequence without conditional jump is achieved.

In addition, the "result" could be 1-bit data, either "0" or "1". Therefore, the internal processor 406 can be designed to output the testing result to the external tester 401 through a single pin of the integrated circuit 407. In other words, the external tester 401 merely monitors the value transmitted via the single pin of the integrated circuit 407 to get the testing result, which further reducing the testing effort. Please note that utilizing one bit to represent the testing result is only meant to serve as an example, and is not meant to taken as a limitation of the present invention. Furthermore, the aforementioned program sequences PROGRAM_2, PROGRAM_3, and PROGRAM_4 are merely used for illustrative purposes not limitations.

Figure 1:
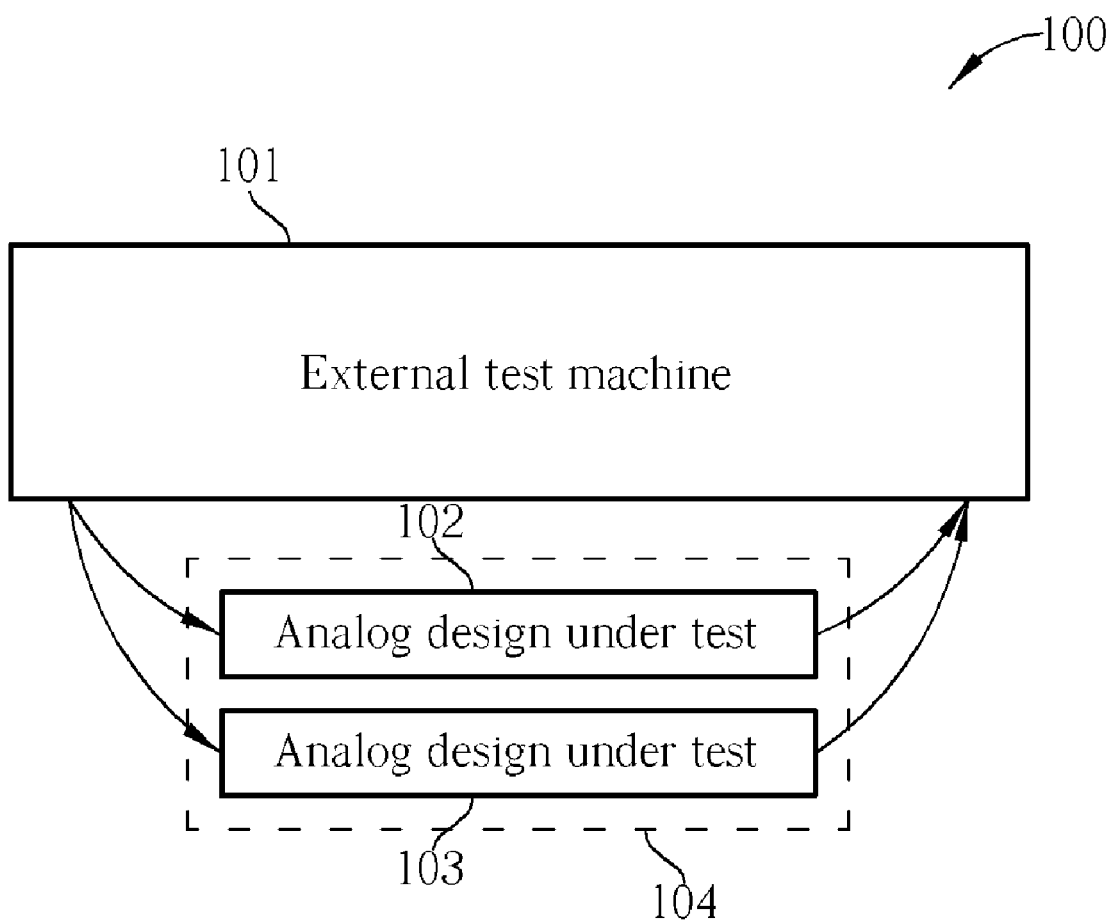
FIG. 1 shows a block diagram of an analog testing system of the related art.
Figure 2:
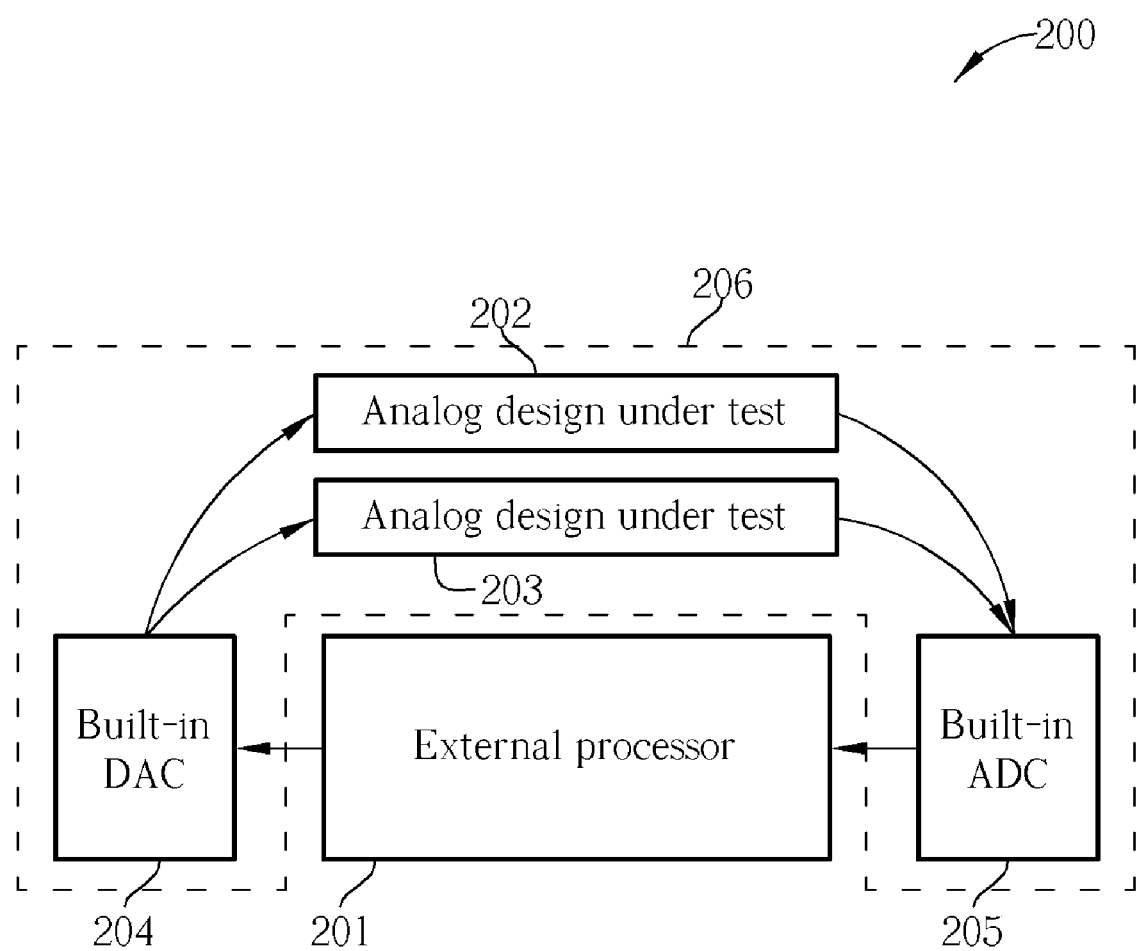
FIG. 2 shows a block diagram of an analog testing system with an external processor of the related art.
Figure 3:
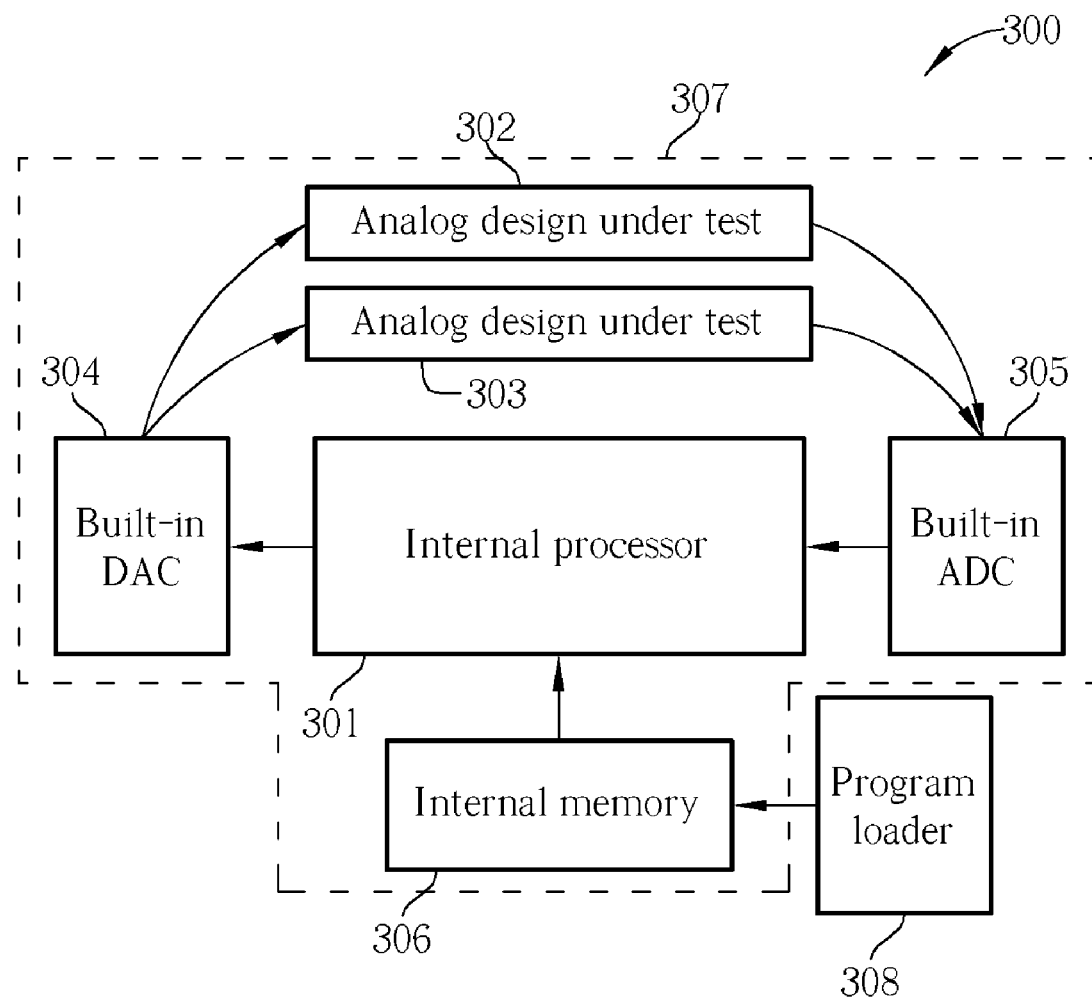
FIG. 3 shows a block diagram of an analog testing system with an internal processor, internal memory and a program loader of the related art.

Comparing the testing systems 100, 200, 300, 400, the related art testing system 100 shown in FIG. 1, utilizing the external test machine 101, has long testing time; the related art testing system 200 shown in FIG. 2, utilizing built-in DAC 204, built-in ADC 205 and external processor 201, has higher testing cost; the related art testing system 300 shown in FIG. 3, utilizing built-in DAC 304, built-in ADC 305, internal processor 301 and internal memory 306, has moderate testing time and moderate testing cost, while the testing system 400 shown in FIG. 4, utilizing the internal processor 406 to directly process the inputted program sequence without any buffering memory for preloading the program sequence, has shortest testing time and lowest testing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testing system comprising:
an integrated circuit comprising:
an analog design under test, for generating an analog testing response; and
a processor; and
an external tester for sequentially outputting a fixed program sequence to the processor;
wherein the processor is arranged to execute the fixed program sequence to predict a testing result of the testing system for generating a predicted testing result, then selectively adjust the predicted testing result according to the analog test response for outputting the testing result to the external tester without processing un-predictable conditional jump, and the fixed program sequence is executed line by line by the processor as each line is received sequentially from the external tester.

2. The testing system of claim 1, further comprising:
a digital-to-analog converter (DAC) for converting a digital testing sequence output from the processor into an analog testing sequence fed into the analog design under test; and
an analog-to-digital converter (ADC) for converting the analog testing response of the analog design under test into a digital testing response fed into the processor.

3. The testing system of claim 2, wherein the ADC is embedded in the integrated circuit.

4. The testing system of claim 2, wherein the DAC is embedded in the integrated circuit.

5. The testing system of claim 1, wherein the external tester further comprises: a digital-to-analog converter (DAC) for converting a digital testing sequence output from the processor into an analog testing sequence fed into the analog design under test.

6. The testing system of claim 1, wherein the external tester further comprises: an analog-to-digital converter (ADC) for converting the analog testing response of the analog design under test into a digital testing response fed into the processor.

7. The testing system of claim 1, wherein the processor outputs the testing result to the external tester through a single pin of the integrated circuit.

8. A testing method comprising:

providing an integrated circuit, the integrated circuit comprising an analog design under test and a processor;

providing an external tester and utilizing the external tester for sequentially outputting a fixed program sequence to the processor; and utilizing the processor to execute the fixed program sequence to predict a testing result of the testing system for generating a predicted testing result, then selectively adjust the predicted testing result according to an analog testing response generated by the analog design under test for outputting the testing result to the external tester without processing un-predictable conditional jump, and the fixed program sequence is executed line by line by the processor as each line is received sequentially from the external tester.

9. The testing method of claim 8, further comprising:

converting a digital testing sequence output of the processor into an analog testing sequence fed into the analog design under test; and converting the analog testing response of the analog design under test into a digital testing response fed into the processor.

10. The testing method of claim 8, wherein the step of providing an external tester and utilizing the external tester for sequentially outputting the fixed program sequence to the processor further comprises:

converting a digital testing sequence output of the processor into an analog testing sequence fed into the analog design under test.

11. The testing method of claim 8, wherein the step of providing an external tester and utilizing the external tester for sequentially outputting the fixed program sequence to the processor further comprises:

converting the analog testing response of the analog design under test into a digital testing response fed into the processor.

12. The testing method of claim 8, wherein the step of utilizing the processor to execute the fixed program sequence further comprises utilizing a single pin of the integrated circuit to output the testing result to the external tester.

* * * * *